United States Patent [19]

Seelbach et al.

[11] Patent Number: 4,723,363
[45] Date of Patent: Feb. 9, 1988

[54] PROCESS FOR REMOVAL OF WATER

[75] Inventors: Christian A. Seelbach, Scottsdale, Ariz.; William M. Ingle, deceased, late of Phoenix, Ariz., by Marie H. Ingle, legal representative

[73] Assignee: Motorola Inc., Schaumburg, Ill.

[21] Appl. No.: 947,234

[22] Filed: Dec. 29, 1986

[51] Int. Cl.[4] .......................... F26B 1/00; F26B 5/04
[52] U.S. Cl. ............................................. 34/9; 34/15; 34/36; 34/92
[58] Field of Search ................ 34/9, 15, 36, 92; 427/248.1, 255.1

[56] References Cited

U.S. PATENT DOCUMENTS

| | | |
|---|---|---|
| 4,307,518 | 12/1981 | Izumo et al. ............................ 34/9 |
| 4,547,404 | 10/1983 | Cambell et al. ................. 427/248.1 |
| 4,554,180 | 11/1985 | Hirooka ............................. 427/248.1 |
| 4,560,589 | 12/1985 | Endou et al. ..................... 427/255.1 |
| 4,598,024 | 7/1986 | Stinton et al. .................... 427/255.1 |
| 4,639,379 | 1/1987 | Asai et al. ........................ 427/248.1 |
| 4,660,297 | 4/1987 | Danielson .............................. 34/15 |

Primary Examiner—Albert J. Makay
Assistant Examiner—David W. Westphal
Attorney, Agent, or Firm—Raymond J. Warren

[57] ABSTRACT

The process utilizes a volatile organo halosilane, such as trimethylchlorosilane, injected through a mass flow controller into a deposition, or like, reactor to dry the mass flow controller, transfer lines and injectors, the deposition surfaces and reactor walls, the exhaust manifold, and vacuum pump and oil.

13 Claims, 3 Drawing Figures

PROCESS FOR REMOVAL OF WATER

BACKGROUND OF THE INVENTION

This invention relates, in general, to a process for enhancing the rate of removal of water from surface during the evacuation cycle prior to processing semiconductor devices and, more particularly, to the addition of a volatile organo chlorosilane prior to the deposition of metallic films on semiconductor device wafers.

Chemical and physical deposition processes such as chemical vapor deposition, low pressure chemical vapor deposition, plasma enhanced chemical vapor deposition, sputtering and E-beam evaporation are utilized for the formation of various thin films. Many of these films are essential in the fabrication of semiconductor devices. Among these are semiconductor materials such as: epitaxial and polycrystalline silicon; dielectric marerials such as silicon oxide and silicon nitride; and metallic materials such as aluminum, gold, and tungsten. More recently, interest in the deposition of advance refractory metallic films such as selective tungsten, tungsten silicide, titanium silicide, titanium nitride, and titanium boride have been used. As applied to the electronics industry, these refractory metallic films are used as: improved gate electrodes and interconnections on MOS devices; contact enhancements to semiconductor materials; metallization of Schottky devices; diffusion barriers; and the like.

Typically, the properties of a thin film are attributed to a combination of the bulk film properties and surface and/or interface effects. Bulk film properties are attributed to the intrinsic properties of the material modified by factors such as chemical composition (and stoichiometry), impurities levels in crystallinity. These bulk film properties include: interface properties which include mechanical properties such as adhesion and stress; physical properties which include crystallinity and defects; electrical properties including contact resistance and conductivity; and chemical properties such as impurity content, stoichiometry and deposition, and etching selectivity. Furthermore, as the film thickness is reduced the surface/interface effects are even more prominent. The interfaces are strongly influenced by surface cleanliness and ambient environment within the deposition reactor at the initiation of the deposition cycle. The major contaminant on nearly all surfaces is water. The source of the water is moisture in the environment and wet chemical processing techniques. Water continues to bond to surfaces even under vacuum because of the strong bonding interaction between the polar water molecules and surfaces.

In addition, "hydrogen bonding" between layers of water molecules accounts for adhesion of water films tens of molecules thick. Prior to the deposition of a film, in an evacuated environment, the atmosphere in the deposition system is removed by mechanical pumping to a pressure between about 0.01 to 0.001 torr. This atmosphere is usually deemed adequate for low pressure chemical vapor deposition applications. Physical deposition systems such as sputter and e-beam evaporation require additional high vacuum pumping (e.g. diffusion pump cryogenic pump) to render pressures less than $10^{-5}$ torr. In both low pressure chemical and physical deposition reactors a major constituent of the residual atmosphere during final pump down is water vapor which is slowly released from the deposition surface and walls of the reactor. Evacuation alone will not remove all of the water from the surfaces without additional techniques, such as heating and/or carrier gas purge.

At the initiation of the deposition cycle, water on the deposition surface and a portion of the water in the reactor come in direct contact with the materials being deposited and in many instances react with these materials as they are being deposited. In the case of metallic source materials, these reactions generally produce a metallic oxide. These water related impurities are concentrated at the interface and make it difficult to etch or deposit with high selectivity. The water related impurities: impair adhesion and electrical contact; add to the stress of many films; and, in general, result in a multitude of processing reliability problems.

An additional problem is encountered in reducing the effects of residual water vapor in a low pressure chemical vapor deposition system or in a plasma enhanced chemical vapor deposition system. Metallic source materials are typically halides of the metal being deposited. These halides are highly reactive with water and form oily residues which adhere to surfaces and further react with water on exposure to the ambient. These types of residues readily clog small orifices like those found in mass flow controllers, check valves, and injectors. Accordingly, the metallic source materials mass flow controllers require substantial maintenance especially after the system has been open to the ambient.

A further problem that should be considered is that of moisture in the vacuum pump oil. During the evacuation cycle, prior to deposition, the pump oil is subjected to increasing concentrations of water vapor. Purging with an inert ambient significantly helps to flush out the water vapor. However, at the completion of the purge cycle, the water level rises again. This water vapor markedly reduces the effective pumping speed especially at reduced pressures. Furthermore, at the initiation of deposition, the metallic source materials react with the water in the pump oil and leave residues which can potentially reduce the life of the oil and pump.

Although some of the foregoing problems can be overcome by using a refractory metal LPCVD reactor, in which all internal surfaces can be heated and flushed before each deposition, these modifications increase the complexity of the reactor and still result in varying quantities of residual water on the surface. Furthermore, problems with mass flow controller reliability and water in the vacuum train remain.

Accordingly, a need has existed for a process for enhancing the rate of removal of water from deposition surfaces, deposition reactors, mass flow controllers, injectors, vacuum pumps and oil, and the like.

SUMMARY OF THE INVENTION

Accordingly, it is an object of this invention to provide a process for removal of water that overcomes the above deficiencies.

A further object of this invention is to provide an improved process for the enhanced rate of removal of water from physical and chemical deposition reactors and deposition surfaces.

Another object of the invention is to provide an improved process for reducing the pumping time required to obtain a vacuum.

Still another object of the invention is to provide an improved process for rendering mass flow meters, transfer lines, injectors, valves and like, free of moisture.

Yet another object of the invention is to provide an improved process for rendering vacuum pumps, turbo molecular pumps, vein pumps, and the like, and pump oil, free of moisture.

Another object of the invention is to provide an improved process that utilizes a volatile source material that reacts with water forming volatile products that are readily removed during evacuation and which do not leave unwanted residues on the deposition surfaces.

The foregoing and other objects and advantages of the invention are achieved through a process described herein.

A particular embodiment of the present invention consists of a process utilizing a volatile organo halosilane $(CH_3)_3SiCl$, injected through a mass flow controller into a metallic thin film deposition reactor to enhance the rate of removal of water from the mass flow controller, transfer lines and injectors, the deposition surfaces and reactor walls, the exhaust manifold, and vacuum pump and oil.

DETAILED DESCRIPTION OF THE DRAWINGS

Figure 1:
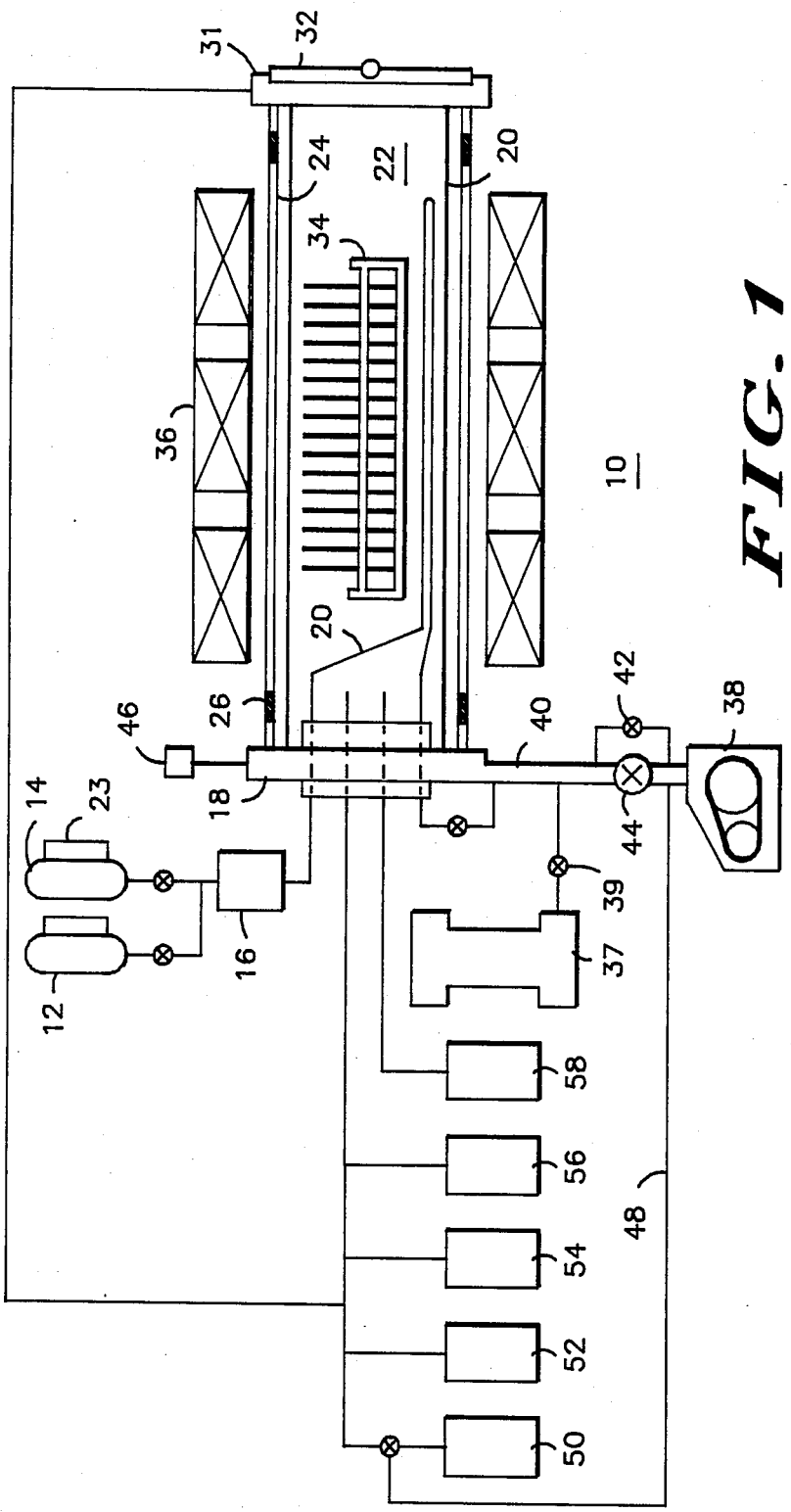
FIG. 1 is a block diagram of a metallic materials deposition apparatus embodying the present invention.

Referring to FIG. 1, a block diagram of a metallic materials deposition apparatus, generally designated 10, embodying the present invention as illustrated. One particular embodiment of the present invention described herein deals with enhanced removal of water from a low pressure deposition apparatus and, in particular, with low pressure deposition of metallic films. However, it should be noted that the present invention is also effective in annealing apparatus and other deposition devices where moisture is a factor. In accordance with the invention, a volatile halosilane, essentially free of multifunctional cross-linking units, is distilled into a deposition chamber 22 during the evacuation of chamber 22. The compound $(CH_3)_3SiCl$ (99.9% purity) will be utilized to demonstrate the invention because $(CH_3)_3SiCl$ and its hydrolysis byproducts are volatile and readily removed during subsequent evacuations. In addition, high purity $(CH_3)_3SiCl$ sources are low in cost and commercially available. However, it should be noted that other similar compounds may be utilized with beneficial results. A generic descriptor of these materials is organo halosilanes and includes trimethylchlorosilane, dimethylchlorosilane, trimethylflorosilane, etc.

Apparatus 10 can be, for example, a low pressure chemical vapor deposition (LPCVD) reactor, a plasma enhanced chemical vapor deposition reactor, or any of a number of thin film metals physical deposition apparatus such as sputtering systems or e-beam evaporation systems. Such systems may have an auxiliary evacuation chamber with load lock for pre-evactuation of the deposition materials. In accordance with the invention, all of the above types of applications are deemed to be within the scope of the invention.

When utilized in chemical vapor deposition (CVD) type reactors, it is generally preferably to inject the drying agent in such a manner that the entire injection manifold: the metallic source materials; the mass flow meters; and the inner connections and injectors into the reactor, are rendered dry. In accordance with the present invention, a trimethylchlorosilane source 12 is connected in parallel with a metal source material, such as titaniumtetrachloride $(TiCl_4)$ or the like, 14 to a mass flow controller 16 and coupled through a reactor end plate 18 into an injector 20 and dispersed into deposition chamber 22. A site glass 23 aides in monitoring the amount of source material. The deposition chamber consists of a quartz reactor tube 24 with opaque quartz rings 26 spaced equal distance within the tube from the tube ends. Opaque quartz rings 26 block the light pipe effect of the clear quartz tube as described in U.S. Pat. Nos. 4,411,619 and 4,480,987. The quartz liner 28 prevents deposition on the walls of the reactor chamber and increases the useful life of the chamber. End cap 30 is provided with a removable door 32 which seals to end cap 30 and which is used for introducing and removing deposition surfaces, illustrated here as a plurality of semiconductor wafers 34. Deposition chamber 22 is heated by a resistance furnace 36. The residual gas in deposition chamber 22 is monitored by a quadrupole gas analyzer (R.G.A.) 37. Metering valve 39 was used to regulate the rate of gas flow and maintain an R.G.A. pressure of $5.1 \times 10^{-6}$ torr using the analysis measurements.

Vacuum pump 38 is coupled to end cap 18 through an exhaust conduit 40 and through pneumatic vacuum control valves 42 and 44. Pneumatic vacuum control valves 42 and 44 are regulated by vacuum gauge 46 attached to end cap 18 which regulates the effect of pumping speed of vacuum pump 38. Above about 6.6 KPa the system is "soft pumped" through pneumatic valve 42; below about 6.6 KPa the system is "hard pumped" through valve 44.

If the refractory metallic film being deposited requires or generates appreciable quantities of hydrogen gas during deposition, the addition of a roots blower (not shown) may be required. An alternate procedure is to add an inert gas purge to the deposition chamber which enhances the pumping speed of pump 38 with respect to hydrogen and circumvents the necessity of a roots blower. In the absence of hydrogen, the pressure in the deposition chamber is controlled (increased) by blasting the vacuum pump with an inert gas through line 48. Additional source and carrier gases 50, 52, 54, 56, and 58 are injected into deposition chamber 22, through end caps 18 and/or 30.

Figure 2:
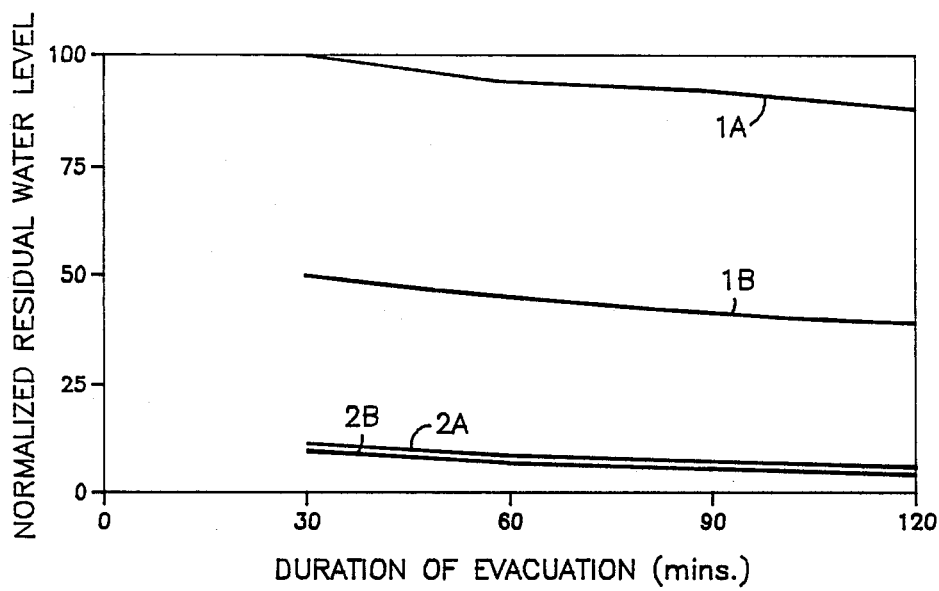
FIG. 2 is a graph depicting residual gas analysis results of enhanced rate of water removal from a metallic deposition apparatus with and without the present invention.

FIG. 2 depicts residual gas analysis results of enhanced rate of water removal from a metallic deposition apparatus with and without argon purge and trimethylchlorosilane drying in accordance with the invention. Residual water levels were measured after 30 minutes of evacuation (and subsequently after 30 minute intervals) and calculated by normalizing the $H_2O$ peak (m/e=18) against the $O_2$ peak (m/e=32). These results demonstrate that the residual water levels in the reactor are decreased by the addition of an inert gas purge and especially decreased by the addition of an inert purge and trimethylchlorosilane drying.

Figure 3:
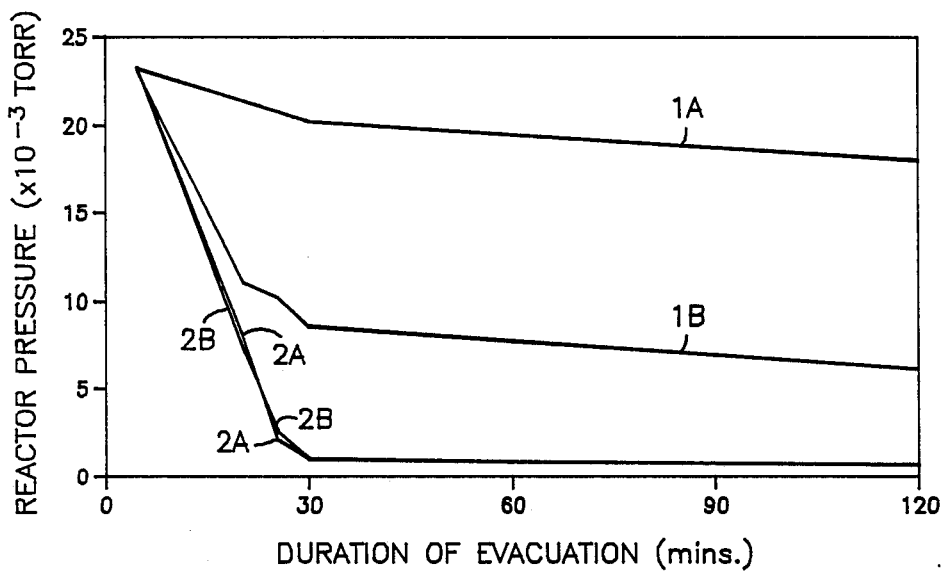
FIG. 3 is a graph showing the rate of evacuation of a metallic deposition apparatus with and without the present invention.

FIG. 3 contrasts enhanced rate of evacuation of a metallic deposition apparatus with and without an argon purge and trimethylchlorosilane drying in accordance with the invention. The background pressure of the reactor was measured on a Granville-Phillips 275 convectron gauge sensitive to about ±1.0 militorr. The rate of evacuation of the reactor markedly increased with addition of the inert gas purge, and especially with the addition of the inert gas purge and trimethylchlorosilane drying. The data depicted in FIGS. 2 and 3 was obtained from examples 1A, 1B, 2A and 2B which follow.

EXAMPLE 1A

A six inch ID refractory metallic materials LPCVD furnace equipped with an argon purge, trimethylchlorosilane source, Granville-Phillips 275 convectron gauge and a quadrupole gas analyzer (R.G.A.) as depicted in FIG. 1, was opened and loaded with fifty 100 millimeter silicon wafers. During the wafer loading operation the reactor remained open for a total of 30 minutes after which it was closed and evacuated for two hours with continuous pumping. In the course of this two hour pumping period, background pressures of the LPCVD reactor were monitored continuously and are shown in Table 1A.

TABLE 1A

| Residual $H_2O$ and pressure levels. | | | | |
|---|---|---|---|---|
| Time (minutes) | Ar Flow rate(sccm) | $(CH_3)_3SiCl$ rate(sccm) | Pressure (militorr) | Water Level |
| 5 | 0 | 0 | 22.8 | — |
| 30 | 0 | 0 | 19.8 | 100 |
| 60 | 0 | 0 | 19.0 | 92 |
| 90 | 0 | 0 | 18.2 | 90 |
| 120 | 0 | 0 | 17.5 | 86 |

Residual water levels also shown in Table 1A were measured by the R.G.A. after 20 minutes (and subsequently at 30 minute intervals) and calculated by normalizing the $H_2O$ peak (m/e=18) against the $O_2$ peak (m/e=32). The residual water level data found in Table 1A is depicted in FIG. 2 the background pressure data in Table 1A is depicted in FIG. 3. In this example, an R.G.A. pressure of $5.1 \times 10^{-6}$ torr was obtained in the $H_2O$ analysis experiment by injecting sufficient residual gas from the LPCVD reactor into the R.G.A. to maintain this pressure.

EXAMPLE 1B

Under identical reactor conditions of example 1A, the reactor again was charged with fifty 100 millimeter silicon wafers and evacuated after being open to the ambient for 30 minutes. In the course of this two hour pumping period, dry argon (Ar) was intermittently injected into the reactor for the first 30 minutes as depicted in Table 1B.

TABLE 1B

| Ar injection. | | | | |
|---|---|---|---|---|
| Time (minutes) | Ar Flow rate(sccm) | $(CH_3)_3SiCl$ rate(sccm) | Pressure (militorr) | Water Level |
| 0-5 | 0 | 0 | atm-22.8 | — |
| 5-20 | 100 | 0 | 22.8-10.6 | — |
| 20-25 | 0 | 0 | 10.6-9.9 | — |
| 25-30 | 100 | 0 | 9.9-8.4 | 50 |
| 60 | 0 | 0 | 7.6 | 45 |
| 90 | 0 | 0 | 6.8 | 41 |
| 120 | 0 | 0 | 6.1 | 38 |

The resultant water levels and reactor pressure are also shown in Table 1B. The residual water level data found in Table 1B is depicted in FIG. 2 and the background pressure data is depicted in FIG. 3.

EXAMPLE 2A Under identical reactor conditions of Examples 1A and 1B, the reactor again was charged with fifty 100 millimeter silicon wafers and then evacuated after being opened to the ambient for 30 minutes. In this experiment trimethylchlorosilane and argon were charged to the reactor as depicted in Table 2A.

TABLE 2A

| $(CH_3)_3SiCl$ and Ar injection at ambient. | | | | |
|---|---|---|---|---|
| Time (minutes) | Ar Flow rate(sccm) | $(CH_3)_3SiCl$ rate(sccm) | Pressure (militorr) | Water Level |
| 0-5 | 0 | 0 | atm-22.8 | — |
| 5-20 | 100 | 45 | 22.8-6.8 | — |
| 20-25 | 0 | 0 | 6.8-2.3 | — |
| 25-30 | 100 | 0 | 2.3-1.0 | 10 |
| 60 | 0 | 0 | 0.8 | 8 |
| 90 | 0 | 0 | 0.7 | 7 |
| 120 | 0 | 0 | 0.7 | 6 |

The resultant water levels and reactor pressures are shown in Table 2A. The residual water level data found in Table 2A is depicted in FIG. 2 and the background pressure is depicted in FIG. 3.

EXAMPLE 2B

Examples 2A and 2B differ in that Example 2A was conducted at ambient reactor temperature (approximately 30° C.), and 2B was conducted at 400° C. Background pressure and residual water data from Example 2B are found in Table 2B.

TABLE 2B

| $(CH_3)_3SiCl$ and Ar injection at 400° C. | | | | |
|---|---|---|---|---|
| Time (minutes) | Ar Flow rate(sccm) | $(CH_3)_3SiCl$ rate(sccm) | Pressure (militorr) | Water Level |
| 0-5 | 0 | 0 | atm-22.8 | — |
| 5-20 | 100 | 45 | 22.8-7.6 | — |
| 20-25 | 0 | 0 | 7.6-1.9 | — |
| 25-30 | 100 | 0 | 1.9-1.0 | 9 |
| 60 | 0 | 0 | 0.8 | 7 |
| 90 | 0 | 0 | 0.7 | 6 |
| 120 | 0 | 0 | 0.7 | 5 |

The residual water level data is depicted in FIG. 2 and the background pressure in FIG. 3.

As can be seen in FIG. 2, the normalized residual water level is greatly reduced through the use of an Argon purge combined with the injection of an organo halosilane, such as trimethylchlorosilane. This results in a cleaner processing environment and fewer defects. In addition, as shown in FIG. 3, the amount of time required to obtain a vacuum in the reactor is greatly reduced. This reduces the time in the processing cycle which allows more processing cycles per unit time which results in an economic benefit.

Thus, it is apparent to one skilled in the art that there has been provided in accordance with the invention, a device and method that fully satisfies the objects, aims and advantages set forth above.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

It is claimed:

1. A method for removing water from a device used in processing a wafer to be utilized in semiconductor devices, said method comprising the steps of:
   purging said device used for processing said wafer with an inert gas; and
   drying said device by injecting an organo halosilane into said device.

2. The method of claim 1 wherein said inert gas is comprised of argon.

3. The method of claim 1 wherein said organo halosilane is comprised of trimethylchlorosilane.

4. The method of claim 1 wherein said organo halosilane is comprised of dimethylchlorosilane.

5. The method of claim 1 wherein said organo halosilane is comprised of trimethylflorosilane.

6. A method of removing water prior to processing wafers, to be used in semiconductor devices, in a chemical vapor deposition reactor comprising the steps of:
   inserting said wafers into a chamber of said chemical vapor deposition reactor;
   sealing said chamber;
   starting a vacuum pump to create a vacuum in said chamber;
   injecting an inert gas into said chamber while continuing the pumping of said vacuum pump; and
   drying said chamber and said wafers by injecting an organo halosilane into said chamber.

7. The method of claim 6 wherein said inert gas is comprised of argon.

8. The method of claim 6 wherein said organo halosilane is comprised of trimethylchlorosilane.

9. The method of claim 6 wherein said organo halosilane is comprised of dimethylchlorosilane.

10. The method of claim 6 wherein said organo halosilane is comprised of trimethylflorosilane.

11. The method of claim 6 further comprising the step of drying a mass flow controller, a transfer line, and an injector with said organo halosilane.

12. The method of claim 6 further comprising the step of drying an exhaust manifold and vacuum pump and oil with said organo halosilane.

13. A method of removing water prior to processing wafers, to be used in semiconductor devices, in a chemical vapor deposition reactor comprising the steps of:
   inserting said wafers into a chamber of said chemical vapor deposition reactor;
   sealing said chamber;
   starting a vacuum pump to create a vacuum in said chamber;
   injecting an inert gas into said chamber while continuing the pumping of said vacuum pump;
   drying a flow controller, a transfer line, and an injector with an organo halosilane;
   drying said chamber and said wafers by injecting said organo halosilane into said chamber; and
   drying an exhaust manifold an vacuum pump and oil with said organo halosilane.

* * * * *